United States Patent
Lee et al.

(10) Patent No.: US 6,797,559 B2
(45) Date of Patent: Sep. 28, 2004

(54) METHOD OF FABRICATING SEMICONDUCTOR DEVICE HAVING METAL CONDUCTING LAYER

(75) Inventors: Chang-won Lee, Seoul (KR); Si-young Choi, Sungnam (KR); Seong-jun Heo, Seoul (KR); Sung-man Kim, Seoul (KR); Min-chul Sun, Busan (KR); Ja-hum Ku, Sungnam (KR); Sun-pil Youn, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/283,844

(22) Filed: Oct. 30, 2002

(65) Prior Publication Data
US 2003/0190800 A1 Oct. 9, 2003

(30) Foreign Application Priority Data
Apr. 4, 2002 (KR) .......................................... 2002-18618

(51) Int. Cl.[7] .......................................... H01L 21/8242
(52) U.S. Cl. ...................... 438/239; 438/595; 438/724; 438/757; 438/787; 438/791
(58) Field of Search ................................ 438/239, 595, 438/706, 724, 787, 757, 791, FOR 177

(56) References Cited

U.S. PATENT DOCUMENTS

| | | | | |
|---|---|---|---|---|
| 5,960,322 A | * | 9/1999 | Xiang et al. | 438/791 |
| 6,117,799 A | * | 9/2000 | Ngo | 438/788 |
| 6,221,793 B1 | * | 4/2001 | Ngo et al. | 438/788 |
| 6,235,654 B1 | * | 5/2001 | Ngo et al. | 438/792 |
| 6,294,480 B1 | * | 9/2001 | Pradeep et al. | 438/763 |
| 6,486,012 B1 | * | 11/2002 | Ono | 438/199 |
| 6,524,975 B2 | * | 2/2003 | Li et al. | 438/792 |
| 6,534,395 B2 | * | 3/2003 | Werkhoven et al. | 438/627 |
| 2002/0072185 A1 | * | 6/2002 | Chen | |
| 2003/0068876 A1 | * | 4/2003 | Agarwal | |

* cited by examiner

Primary Examiner—George Fourson
Assistant Examiner—Michelle Estrada
(74) Attorney, Agent, or Firm—F. Chau & Associates, LLP

(57) ABSTRACT

A method of manufacturing a semiconductor device having a metal conducting layer is provided. A metal conducting layer pattern having the metal conducting layer is formed on a semiconductor substrate. A portion of the metal conducting layer is partially exposed on the semiconductor substrate. The semiconductor substrate having the metal conducting layer pattern is loaded into a reaction chamber. A first silicon source gas is flowed into the reaction chamber. A silicon oxide layer is formed on the semiconductor substrate having the metal conducting layer pattern by supplying a second silicon source gas and an oxygen source gas into the reaction chamber.

20 Claims, 5 Drawing Sheets

METHOD OF FABRICATING SEMICONDUCTOR DEVICE HAVING METAL CONDUCTING LAYER

BACKGROUND OF THE INVENTION

1. Field of the Invention

The present invention relates to a semiconductor device having a metal conducting layer and, more particularly, to a semiconductor device having a metal conducting layer for preventing an exposed metal layer from being oxidized.

2. Description of the Related Art

In semiconductor memory devices, especially, dynamic random access memory (DRAM) devices including a unit cell having one transistor and one capacitor, a gate line acting as a conducting line for transmitting signals to a gate electrode of a transistor and a plurality of gate lines are integrally formed in one direction on a silicon substrate. Lateral surfaces of the gate lines are covered by spacers formed by insulating material for insulating surrounding circuits of the gate lines and for insulating a direct contact (DC) and a buried contact (BC). Generally, the spacers are formed from a silicon nitride (SiN) layer because silicon nitride has good insulating efficiency and does not deteriorate from a thermal process.

According to a conventional spacer forming method using a silicon nitride as a spacer, a gate-insulating layer, a gate conducting layer, and a gate mask layer are sequentially deposited on a silicon substrate and patterned to form a gate line pattern using a photolithography process. Next, a silicon nitride layer is deposited on the silicon substrate having the gate line pattern, and a silicon nitride spacer is formed at a lateral surface of the gate line pattern by etching the silicon nitride layer until exposing a surface of the gate mask layer and the silicon substrate.

According to a conventional method, if an etching selectivity between the silicon nitride layer and the silicon substrate is small, the surface of the silicon substrate can be damaged. The damaged silicon substrate can cause leakage current to flow to a storage capacitor, thereby deteriorating the refresh characteristics of a DRAM.

Recently, a dual spacer having a silicon oxide layer and a silicon nitride layer has been developed. The dual spacer is formed as follows: a gate insulating layer, a gate conducting layer, and a gate insulating mask are sequentially formed on a silicon substrate, then patterned to form a gate line pattern; next, a silicon oxide layer and a silicon nitride layer are sequentially deposited on the silicon substrate having the gate line pattern; and a dual spacer having a silicon oxide layer and a silicon nitride layer is formed at a lateral surface of the gate line pattern by etching the silicon nitride layer until the surface of the silicon oxide layer is exposed.

According to the above method of forming a dual spacer, as an etching selectivity between the silicon nitride layer and the silicon oxide layer is large and the silicon oxide layer acts as an etching blocking layer during etching the silicon nitride layer, the dual spacer is formed without having damage upon removal of the remaining silicon oxide layer.

On the other hand, even though a gate line is generally formed of a conducting layer such as a polysilicon layer and a metal silicide layer, a metal gate line having a pure metal layer such as tungsten and titanium has been developed. When a method of forming a dual spacer is applied to the metal gate line, after forming a gate line pattern having the pure metal layer, when a silicon oxide is deposited the exposed metal layer may be oxidized. The undesirable oxidation at the surface of the metal layer can lower an effective surface area of a conducting line, increase the resistance of the conducting line, and result in the gate line pattern not having a vertical profile.

Therefore, it is highly desirable to provide a method of manufacturing a semiconductor device having a metal conducting layer to prevent an exposed metal layer from being oxidized when a silicon oxide layer is deposited to insulate a conducting layer such as a pure metal layer. Further, it is highly desirable to provide a method of manufacturing a semiconductor device including a metal conducting layer having a vertical profile.

SUMMARY OF THE INVENTION

A method of manufacturing a semiconductor device having a metal conducting layer is provided, the method includes the steps of: forming a metal conducting layer pattern having the metal conducting layer on a semiconductor substrate, a portion of the metal conducting layer being partially exposed on the semiconductor substrate; loading the semiconductor substrate having the metal conducting layer pattern into a reaction chamber; flowing a first silicon source gas into the reaction chamber; and forming a silicon oxide layer on the semiconductor substrate having the metal conducting layer pattern by supplying a second silicon source gas and an oxygen source gas into the reaction chamber.

According to an embodiment of the present invention, the step of flowing the first silicon source gas is performed within an incubation period during which silicon is not deposited onto the metal conducting layer. The step of flowing the first silicon source gas is performed within about 60 seconds. The step of flowing the first silicon source gas is performed at a pressure of the reaction chamber of about 0.001 torr to about 500 torr and at a temperature of the semiconductor substrate of about 500° C. to 1000° C. The step of flowing the first silicon source gas into the reaction chamber is performed within a flow rate of the silicon source gas of 100 sccm. The metal conducting layer is one of a tungsten layer and a titanium layer. The first silicon source gas is selected from the group consisting of $SiH_4$, $Si_2H_6$, and DCS (dichloro silane). The second silicon source gas is selected from the group consisting of $SiH_4$, $Si_2H_6$, and DCS (dichloro silane).

Preferably, the method further includes an oxygen source gas in the step of flowing the first silicon source gas. The silicon source gas is flowed into the reaction chamber in advance of the oxygen source gas. The oxygen source gas is $N_2O$ or $O_2$.

A method of manufacturing a semiconductor device having a metal conducting layer is also provided, the method includes the steps of: forming a gate pattern having the metal conducting layer on a semiconductor substrate; loading the semiconductor substrate having the gate pattern into a reaction chamber; flowing a first silicon source gas into the reaction chamber; and forming a silicon oxide layer on the semiconductor substrate having the gate pattern by supplying a second silicon source gas and an oxygen source gas into the reaction chamber; forming a silicon nitride layer on the silicon oxide layer; and forming spacers on lateral surfaces of the gate pattern by etching the silicon nitride layer until exposing the silicon oxide layer.

According to an embodiment of the present invention, the step of flowing the first silicon source gas is performed within an incubation period during which silicon is not deposited onto the metal conducting layer. The reaction chamber is a single wafer type reaction chamber. The step of flowing the first silicon source gas is performed within about 60 seconds at a pressure within of the reaction chamber of about 0.001 torr to about 500 torr and at a temperature of the semiconductor substrate of about 500° C. to 1000° C., and within a flow rate of the first silicon source gas of 100 sccm. The gate pattern is formed by sequentially depositing a gate insulating layer, a polysilicon layer, a metal conducting layer, and a mask layer on the silicon substrate.

Preferably, the method further includes an oxygen source gas in the step of flowing the first silicon source gas. The oxygen source gas is $N_2O$ or $O_2$. The silicon source gas is flowed into the reaction chamber in advance of the oxygen source gas. The first silicon source gas and the second silicon source are selected from the group consisting of $SiH_4$, $Si_2H_6$, and DCS (dichloro silane).

BRIEF DESCRIPTION OF THE DRAWINGS

The above and other objects and advantages of the present invention will become more apparent by describing in detail-preferred embodiments thereof with reference to the accompanying drawings in which.

DETAILED DESCRIPTION OF PREFERRED EMBODIMENTS

Figure 1:
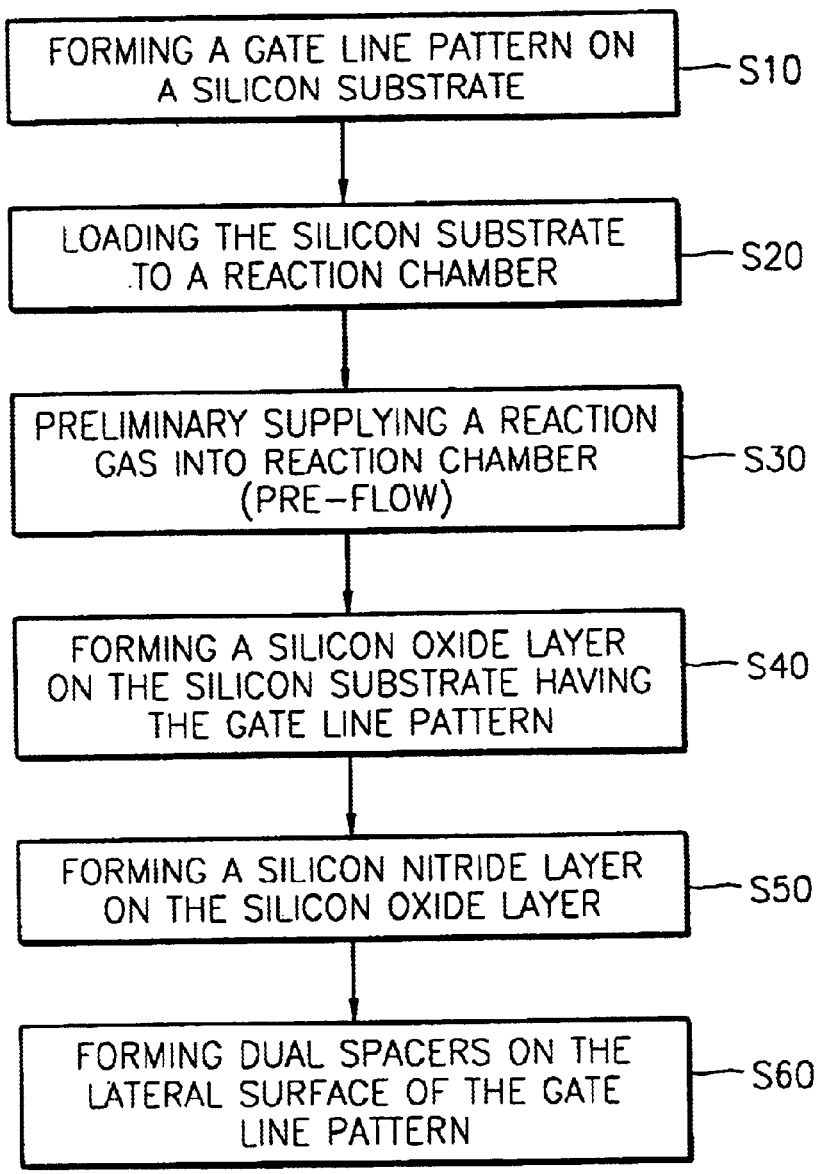
FIG. 1 is a flow chart for describing a manufacturing method of a semiconductor device having a metal conducting layer according to an embodiment of the present invention.
Figure 2:
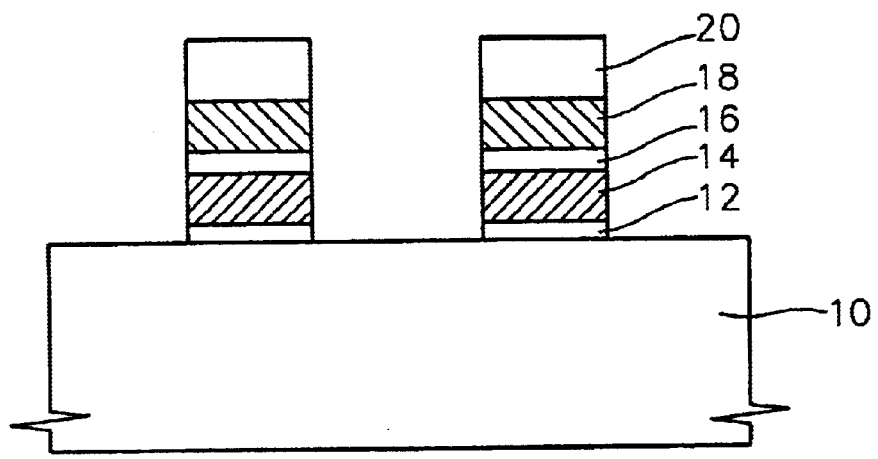
FIGS. 2 to 5 are cross-sectional diagrams for describing a manufacturing method of a semiconductor device having a metal conducting layer according to an embodiment of the present invention.

Hereinafter, the present invention will be described in detail with reference to the accompany drawings. It should be noted that like reference numerals are used for designation of like or equivalent parts or portion for simplicity of illustration and explanation. Also, in the following description, specifications will be made to provide a thorough understanding about the present invention. It is apparent to one skilled in the art that the present invention can be achieved without the specifications. There will be omission of detailed description about well-known functions and structures to clarify key points of the present invention.

According to an embodiment of the present invention, a silicon oxide layer is formed on a silicon substrate having a metal gate line pattern by an atomic layer deposition (ALD) process. The ALD process is performed under about 100° C. for preventing a metal layer of the metal gate line pattern, such as tungsten, from being oxidized, thereby forming a vertical profile of the gate line pattern. However, as chloride ($Cl_2$) in a silicon source and carbon (C) in pyridine (used as a catalyst) are included in the ALD process, the characteristics of a formed transistor may be deteriorated by those impurities such as chlorine and carbon. Thus, the present invention provides a method of forming dual spacers including a silicon oxide layer, which has a vertical profile and does not include impurities in the oxidized metal layer.

FIG. 1 is a flow chart for describing a manufacturing method of a semiconductor device having a metal conducting layer according to an embodiment of the present invention, and FIGS. 2 to 5 are cross-sectional diagrams for describing a manufacturing method of a semiconductor device having a metal conducting layer according to an embodiment of the present invention.

Referring to FIGS. 1 to 5, a gate line pattern is formed on a silicon substrate 10 (S10). The gate line pattern is formed using a photolithography process and by sequential depositing of a gate oxide layer as a gate insulating layer 12, a polysilicon layer as a first conducting layer 14, a tungsten nitride layer as a second conducting layer 16, a tungsten layer as a third conducting layer 18, and a silicon nitride layer as a gate mask layer 20 on the silicon substrate 10.

Next, the silicon substrate 10 having the gate line pattern is loaded to a reaction chamber (not shown) for performing low-pressure chemical vapor deposition (S20). According to an embodiment of the present invention, a single wafer type reaction chamber reaction chamber is used as the reaction chamber. However, one skilled in the art can readily appreciate that other types of chambers such as a furnace loading the silicon substrate in a vertical direction for performing low-pressure chemical vapor deposition, can also be used. The reaction chamber is controlled to have a constant pressure between about 0.001 torr to 500 torr. The pressure can be controlled by pumping out exhausted gases at a controlled rate. Temperature can be maintained between about 500° C. to about 1000° C. by controlling a heater installed in the reaction chamber. An inert gas such as nitrogen gas and argon gas is also continuously flowed into the reaction chamber. According to a preferred embodiment of the present invention, the pressure of the reaction chamber is constantly maintained at about 200 torr, the temperature of the semiconductor substrate 10 is constantly maintained at about 750° C., and the flow rate of the nitrogen gas is constantly maintained at about 9000 sccm (standard $cm^3$)

Next, a reaction gas is preliminary supplied into the reaction chamber (hereinafter "pre-flow step") (S30). The reaction gas is for forming a silicon oxide on the surface of the silicon substrate 10 having the gate line pattern. The reaction gas includes a silicon source gas and an oxygen source gas. According to an embodiment of the present invention, the silicon source gas is selected from a group consisting of $SiH_4$, $Si_2H_6$, and DCS (dichloro silane), which are impurities free, and the oxygen source gas is $N_2O$ or $O_2$.

The pre-flow step is preformed for an incubation period during which a silicon is not deposited onto the silicon substrate. During the pre-flow step, a nitrogen gas or an argon gas is continuously flowed into the reaction chamber. Since the incubation period varies depending upon reaction gases, pressure, and temperature, pertinent conditions should be set so that silicon is not deposited. If silicon is deposited on the silicon substrate 10, the resistance of the gate line is increased when a metal silicide is formed during a subsequent deposition process or thermal process. In case that a gate line pattern is formed of a polysilicon layer and a metal layer on a silicon substrate, dopants in the polysilicon layer can be diffused to form a leakage current path between the gate line and the silicon substrate.

According to an embodiment of the present invention, during the pre-flow step, silicon source gas is solely supplied into the reaction chamber. The oxygen source gas is supplied after supplying the silicon source gas; alternatively, the silicon source gas and the oxygen source gas are concurrently supplied into the reaction chamber.

During the pre-flow step (S30), the reaction chamber is constantly maintained at a pressure between about 0.001 torr to 500 torr by controlling a pumping rate of exhausted gases, and a temperature between about 500° C. to about 1000° C. by controlling a heater in the reaction chamber. An inert gas such as a nitrogen gas or an argon gas is continuously flowed into the reaction chamber. The period of the pre-flow step (S30) is controlled within about 60 seconds and a flow rate of the silicon source gas is controlled to have about 0.01 sccm to about 100 sccm. During the pre-flow step (S30), the silicon source gas is preferably $SiH_4$ of about 2 sccm supplied for about 1 second. Process conditions can be varied within the limitation of not having a deposited silicon during the pre-flow step (S30).

Figure 3:
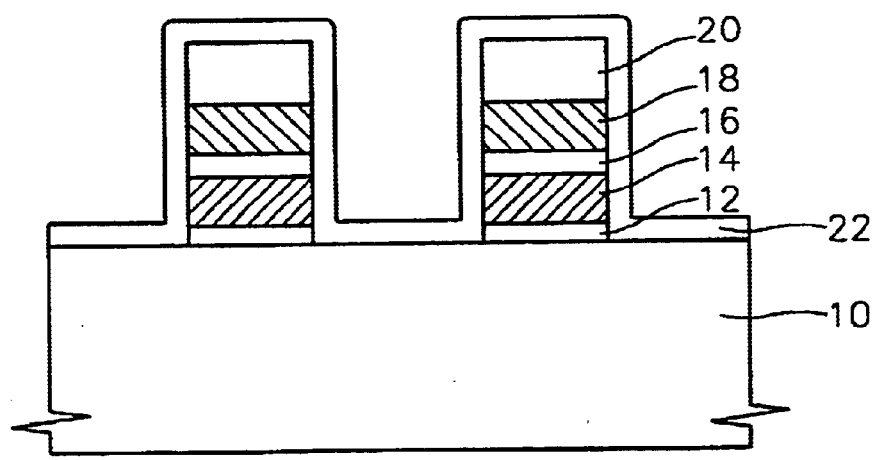

Next, referring to FIGS. 1 and 3, a silicon oxide layer 22 is formed on the whole surface of the semiconductor substrate 10 having the gate line pattern by supplying a silicon source gas and a reaction gas into the reaction chamber (hereinafter "main-flow step") (S40). The reaction conditions of the main-flow step such as pressure and temperature are maintained similar to those in the pre-flow step (S30). A flow rate of the silicon source gas can be set between about 0.01 sccm and about 100 sccm. Preferably, a flow rate of $SiH_4$ is about 2 sccm and a flow rate of $N_2O$ is about 1500 sccm.

Figure 4:
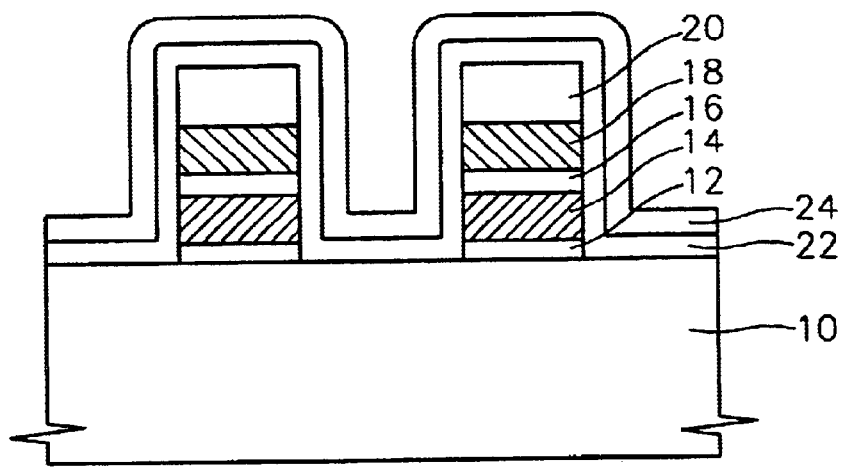

Next, referring to FIGS. 1 and 4, a silicon nitride layer 24 is formed on the silicon oxide layer 22 by a chemical vapor deposition process (S50).

Figure 5:
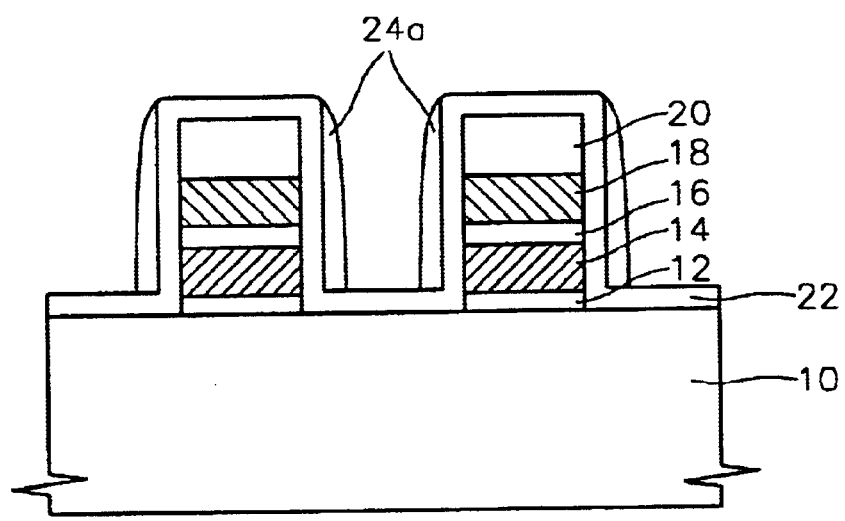

Next, referring to FIGS. 1 and 5, the entire surface of the silicon nitride layer 24 is etched until the silicon oxide layer 22 is exposed. Then, a silicon nitride spacer 24A remains on the lateral surface of the gate line pattern because an etching selectivity of the silicon nitride and the silicon oxide is very high. Any remaining silicon oxide layer (not shown) between the gate line patterns is removed by a wet etching process, then, dual spacers having a silicon oxide layer 22 and a silicon nitride layer 24A are formed on the lateral surface of the gate line pattern (S60).

Figure 6:
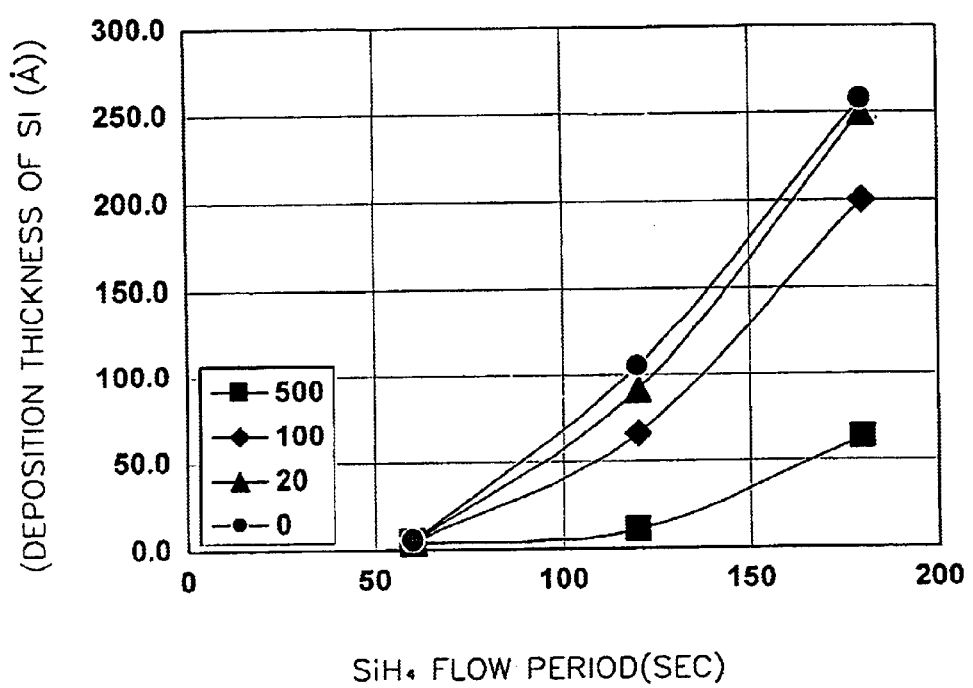
FIG. 6 is a graph for describing a relationship of a flow time of $SiH_4$ and a deposited thickness of Si according to an embodiment of the present invention.

FIG. 6 is a graph for describing a relationship of a flow time of $SiH_4$ and a deposited thickness of Si for deciding a pertinent pre-flow period. The x-axis denotes a flow period of $SiH_4$ and the y-axis denotes a deposited thickness of Si. An experimental was performed in a single wafer type reaction chamber, a temperature of the semiconductor substrate was set at about 650° C., an argon gas as an inert gas was flowed into the reaction chamber at a rate of about 100 sccm, a hydrogen gas as a dilution gas was flown into the reaction chamber at a rate of about 0, 20, 100, and 500 sccm, and a $SiH_4$ gas was flowed into the reaction chamber at a rate of about 150 sccm.

Referring to FIG. 6, an incubation period, which is a period not having a deposited Si, was about 60 seconds independent of the flow rate of the dilution gas.

Figure 7:
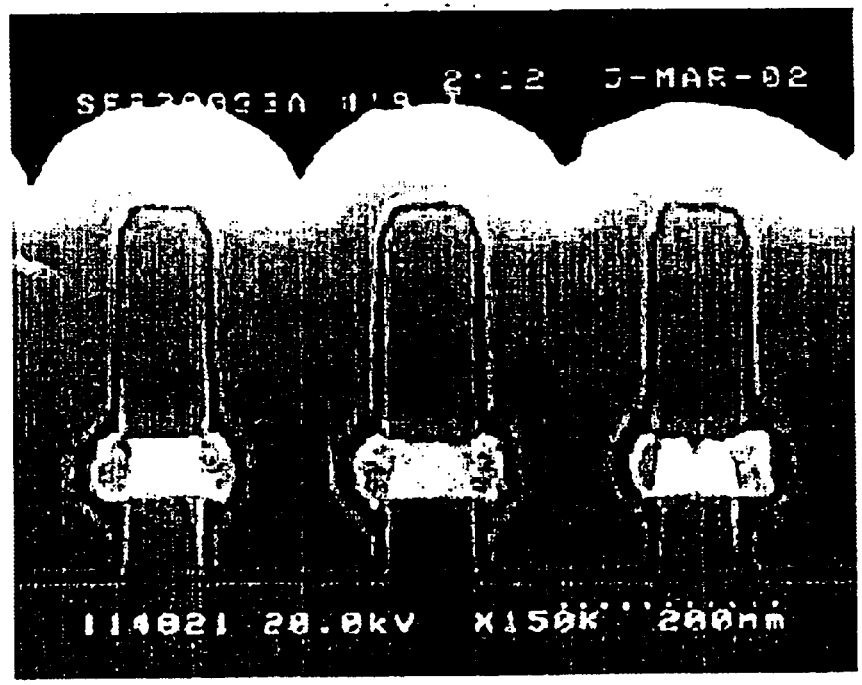
FIG. 7 is a scanning electronic microscopy (SEM) image showing a conventional oxide deposition profile of a semiconductor device.
Figure 8:
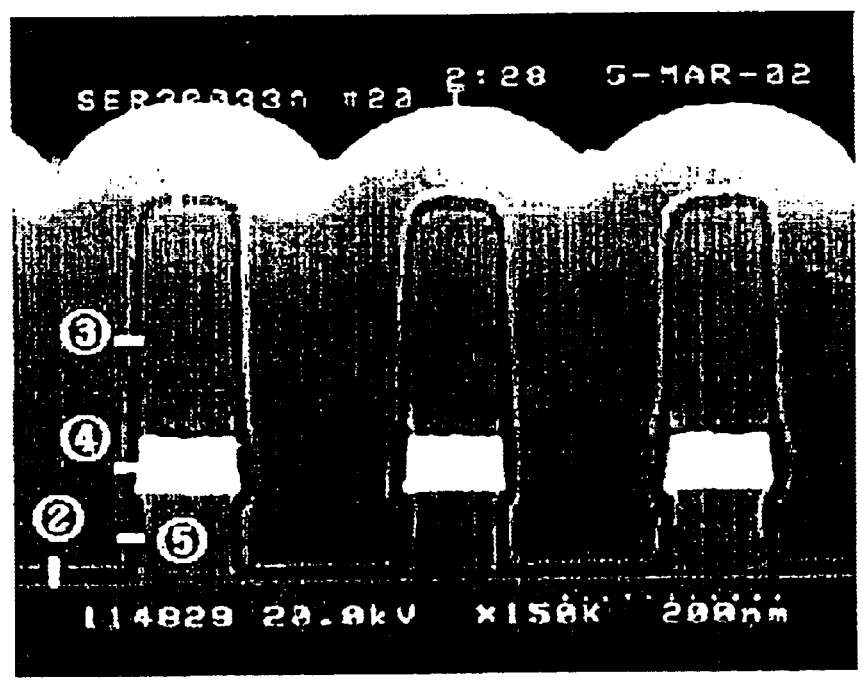
FIG. 8 is a SEM image showing an oxide deposition profile of a semiconductor device having a metal conducting layer according to an embodiment of the present invention.

FIG. 7 is an SEM (scanning electronic microscopy) image showing a conventional oxide deposition profile of a semiconductor device, and FIG. 8 is an SEM image showing an oxide deposition profile of a semiconductor device having a metal conducting layer according to an embodiment of the present invention.

The gate line patterns of FIGS. 7 and 8 include a gate oxide layer, a polysilicon layer, a tungsten nitride layer, a tungsten layer, and a silicon nitride layer, which are sequentially deposited on a silicon substrate and patterned to form a gate line pattern. Silicon oxide layers of FIGS. 7 and 8 were formed at a temperature of about 750° C. under a pressure of about 200 torr. In FIG. 7, the silicon oxide layer was formed by a $SiH_4$ gas as a silicon source gas of about 2 sccm and a $N_2O$ gas as an oxygen source gas of about 1500 sccm without performing a pre-flow step. In FIG. 8, the silicon oxide layer was formed by a $SiH_4$ gas as a silicon source gas of about 2 sccm and a $N_2O$ gas as an oxygen source gas about 1500 sccm after performing a pre-flow step by using a $SiH_4$ gas of about 2 sccm for about 1 second. After forming the silicon oxide layers, to compare profiles of an oxidation of the tungsten layer and the silicon oxide layer, a polysilicon layer was deposited at a thickness of about 2000 Å on the silicon substrate having the silicon oxide layer and the silicon substrate was cut in a vertical direction. Next, the silicon substrate was treated by a HF solution. By the treatment of the HF solution, the silicon oxide layer was selectively etched because an etching rate of the silicon oxide layer was higher than the polysilicon layer and the gate line pattern. From FIGS. 7 and 8, the black lines along with the gate line pattern denote a profile of the deposited silicon oxide layer.

Referring to FIG. 7, during forming the silicon oxide layer, the tungsten layer is oxidized, thereby lowering a surface area of the tungsten layer, and the oxidized tungsten layer is bulged or protruded, thereby deteriorating a profile of the silicon oxide layer. In contrast, referring to FIG. 8, during forming the silicon oxide layer, the tungsten layer is not oxidized, therefore, the gate line pattern has a substantially vertical profile, without the bulging seen in FIG. 7.

Table 1 shows the thicknesses of parts (1) to (5) shown in FIG. 8 for forming a desired thickness of the silicon oxide layer on the gate line pattern according to an embodiment of the present invention.

TABLE 1

|  | Cell Region | | | Peripheral Region (Unit: Å) | | |
| --- | --- | --- | --- | --- | --- | --- |
|  | Top | Middle | Bottom | Top | Middle | Bottom |
| (1) | 139 | 147 | 110 | 170 | 147 | 124 |
| (2) | 124 | 108 | 109 | 162 | 155 | 120 |
| (3) | 108 | 85 | 62 | 101 | 78 | 70 |
| (4) | 116 | 78 | 70 | 116 | 109 | 93 |
| (5) | 93 | 78 | 62 | 116 | 85 | 70 |
| Average of (1) + (2) | 132 | 128 | 110 | 166 | 151 | 122 |
| Average of (3) + 4) + (5) | 106 | 80 | 65 | 111 | 91 | 78 |
| Step coverage | 80% | 63% | 59% | 67% | 60% | 64% |

Referring to Table 1, the step coverage is a ratio of average of (1)+(2) and average of (3)+4)+(5). The step coverage is near or above 60%, a percentage considered excellent in the art.

According to an embodiment of the present invention, a gate line pattern is formed by sequentially depositing a gate oxide layer, a polysilicon layer, a tungsten nitride layer, a tungsten layer, a silicon nitride layer and patterning the sequentially deposited layers, but are not limited to various conducting patterns having a low resistance metal layer such as a tungsten layer and a titanium layer and forming a silicon oxide layer on an exposed metal layer of the conducting pattern.

Further, even though a reaction chamber for a pre-flow step is explained by a single wafer type reaction chamber, one skilled in the art can readily appreciate that other chambers such as a furnace can also be used with regulated pressure, temperature, and flow rates of the reaction source gases.

Advantageously, a metal layer in a gate line pattern is prevented from oxidizing by inputting a silicon source gas or a mixture of silicon source gas and an oxygen source gas into a reaction chamber before forming an oxide layer. Therefore, the metal layer is prevented from increasing in resistance.

Further, a silicon oxide layer can have a vertical profile, thereby easily performing follow-up processes such as deposition and etching processes and easily forming dual spacers without damaging a silicon substrate and mixing impurities.

Although the present invention has been described herein with reference to the accompanying drawings, it is to be understood that the present invention is not limited to those precise embodiments, and various other changes and modifications may be affected therein by one skilled in the art without departing from the scope or spirit. All such changes and modifications are intended to be included within the scope of the invention as defined by the appended claims.

What is claimed is:

1. A method of manufacturing a semiconductor device having a metal conducting layer, the method comprising the steps of:

forming a metal conducting layer pattern having the metal conducting layer on a semiconductor substrate, a portion of the metal conducting layer being partially exposed on the semiconductor substrate;

loading the semiconductor substrate having the metal conducting layer pattern into a reaction chamber;

flowing a first silicon source gas into the reaction chamber prior to the step of forming a silicon oxide layer, wherein the step of flowing the first silicon source gas is performed within an incubation period during which silicon is not deposited onto the metal conducting layer; and forming the silicon oxide layer on the semiconductor substrate having the metal conducting layer pattern by supplying a second silicon source gas and an oxygen source gas into the reaction chamber.

2. The method of claim 1, wherein the step of flowing the first silicon source gas is performed for a duration of about 60 seconds.

3. The method of claim 1, wherein the step of flowing the first silicon source gas is performed at a pressure of the reaction chamber of about 0.001 torr to about 500 torr and at a temperature of the semiconductor substrate of about 500° C. to 1000° C.

4. The method of claim 1, wherein the step of flowing the first silicon source gas into the reaction chamber is performed within a flow rate of the silicon source gas of 100 sccm.

5. The method of claim 1, wherein the metal conducting layer is one of a tungsten layer and a titanium layer.

6. The method of claim 1, wherein the first silicon source gas is selected from the group consisting of $SiH_4$, $Si_2H_6$, and DCS (dichloro silane).

7. The method of claim 1, wherein the second silicon source gas is selected from the group consisting of $SiH_4$, $Si_2H_6$, and DCS (dichloro silane).

8. The method of claim 1, further comprising an oxygen source gas in the step of flowing the first silicon source gas.

9. The method of claim 8, wherein the second silicon source gas is flowed into the reaction chamber in advance of the oxygen source gas.

10. The method of claim 8, wherein the oxygen source gas is $N_2O$ or $O_2$.

11. A method of manufacturing a semiconductor device having a metal conducting layer, the method comprising the steps of:

forming a gate pattern having the metal conducting layer on a semiconductor substrate;

loading the semiconductor substrate having the gate pattern into a reaction chamber;

flowing a first silicon source gas into the reaction chamber prior to the step of forming a silicon oxide layer, wherein the step of flowing the first silicon source gas is performed within an incubation period during which silicon is not deposited onto the metal conducting layer; and forming the silicon oxide layer on the semiconductor substrate having the gate pattern by supplying a second silicon source gas and an oxygen source gas into the reaction chamber;

forming a silicon nitride layer on the silicon oxide layer; and forming spacers on lateral surfaces of the gate pattern by etching the silicon nitride layer until exposing the silicon oxide layer.

12. The method of claim 11, wherein the reaction chamber is a single wafer type reaction chamber.

13. The method of claim 12, wherein the step of flowing the first silicon source gas is performed for a duration of about 60 seconds at a pressure within of the reaction chamber of about 0.001 torr to about 500 torr and at a temperature of the semiconductor substrate of about 500° C. to 1000° C., and within a flow rate of the first silicon source gas of 100 sccm.

14. The method of claim 11, wherein the gate pattern is formed by sequentially depositing a gate insulating layer, a polysilicon layer, a metal conducting layer, and a mask layer on the silicon substrate.

15. The method of claim 11, further comprising an oxygen source gas in the step of flowing the first silicon source gas.

16. The method of claim 15, wherein the oxygen source gas is $N_2O$ or $O_2$.

17. The method of claim 15, wherein the second silicon source gas is flowed into the reaction chamber in advance of the oxygen source gas.

18. The method of claim 11, wherein the first silicon source gas and the second silicon source are selected from the group consisting of $SiH_4$, $Si_2H_6$, and DCS (dichloro silane).

19. The method of claim 1, wherein the step of flowing the first silicon source gas includes continuously flowing a nitrogen gas or an argon gas into the reaction chamber.

20. The method of claim 11, wherein the step of flowing the first silicon source gas includes continuously flowing a nitrogen gas or an argon gas into the reaction chamber.

* * * * *